United States Patent

Cricchi

[15] 3,657,614

[45] Apr. 18, 1972

[54] MIS ARRAY UTILIZING FIELD INDUCED JUNCTIONS

[72] Inventor: James R. Cricchi, Baltimore, Md.

[73] Assignee: Westinghouse Electric Corporation, Pittsburgh, Pa.

[22] Filed: June 15, 1970

[21] Appl. No.: 46,381

[52] U.S. Cl. ....................317/235 R, 317/235 B, 317/235 R, 317/235 G, 317/235 AG

[51] Int. Cl. ....................H01l 11/14

[58] Field of Search ..........317/235 B, 235 R, 235 G, 235 AG

[56] References Cited

UNITED STATES PATENTS 3,564,355 2/1971 Lehovec ....................317/235

*Primary Examiner*—John W. Huckert
*Assistant Examiner*—Martin H. Edlow
*Attorney*—F. Shapoe and C. L. Menzemer

[57] ABSTRACT

A high density MIS array on a single substrate wherein at least two series coupled transistors are provided comprising two diffused junctions separated laterally in one surface of the substrate with a pair of spaced apart gate electrodes located intermediate thereof and separated therefrom by a first layer of insulated material. Another or top electrode separated from the pair of gate electrodes by a second layer of insulated material extends above and across to at least the closest edge of the two diffused junctions. A bias potential is applied between the substrate and the top electrode whereby field induced regions and respective P-N junctions are generated in the surface of the substrate between the diffused junctions in the region not subtended by the two gate electrodes. Two MIS transistors result having a common field induced junction therebetween, said common field induced junction acting as the drain for one transistor and the source for the other transistor.

10 Claims, 4 Drawing Figures

MIS ARRAY UTILIZING FIELD INDUCED JUNCTIONS

BACKGROUND OF THE INVENTION

1. Field of the Invention

This invention relates to semiconductive devices of the MIS (metal-insulator-semiconductor) type including MOS (metal-oxide-semiconductor) devices and MNS (metal-nitride-semiconductor) devices. Such devices are currently utilized in integrated logic circuits in which a large array of said devices are fabricated on a single substrate body such as silicon. Moreover, the devices of greatest interest which incorporate the MIS structure are field effect transistors.

2. Description of the Prior Art

MIS transistors having diffused drain and source regions as well as the methods of making them are well known to those skilled in the art. Prior art techniques for making structures such as those described normally involve the growth of an oxide layer on a substrate which may be, for example silicon; etching the oxide layer to form the desired pattern; diffusion of impurities therein to form localized diffused layers or regions; and finally etching an evaporated metal film to form the electrodes or conductive surface layer. The diffusion step and the metal etching step both require masks to define the desired pattern. Techniques for forming diffusion and metalization masks on semiconductors are highly developed and have been very effective for making semiconductor devices heretofore. However, the prior art methods have been found to be deficient in terms of yield. This is largely due to the fact that where the fabrication technique requires more than one critical masking operation, it is difficult to obtain proper registration between the first pattern and a subsequent pattern with a tolerable yield. One of the limitations on the allowable density or numbers of devices which can be fabricated on a selected size or substrate is the diffusion of the junctions laterally. Another limitation is the metal-to-metal spacing between gates and ohmic contacts.

One method of correcting this problem is taught in U.S. Pat. 3,475,234 issued to R.E. Kerwin, et al. wherein a layer of polycrystalline silicon is deposited on the insulating layer and the diffusion pattern is formed by etching through both layers. The diffusion regions are formed in the usual ways. During diffusion, however, the silicon layer is doped with impurities also so that it becomes sufficiently conductive to function as a conductive film on the gate structure. The formation of the diffused regions with the ultimate conductive layer already in place serving as the diffusion mask assures proper orientation between the three layers.

Although field induced regions and junctions are known such as for example U.S. Pat. 3,473,032, issued to K. Lehovec, it does not disclose the use of field induced junctions in multiple layer structures to achieve high density MIS arrays. The Lehovec patent merely discloses at least one P region and at least one N region induced in a semiconducting material with a resulting P-N junction between the induced P and N regions whereby the P-N junction becomes a photoelectric element.

Three problems nevertheless still exist which are:

1. Alignment of gate electrodes in MIS transistors over a respective diffused region defining the drain and source;
2. Limitation of the spacing between diffused regions caused by lateral diffusion of the regions during manufacture plus the required minimum width of the gate metal; and
3. Reduction of speed of operation by the gate to drain feedback capacitance.

SUMMARY OF THE INVENTION

This invention is an improvement over the prior art and the problems encountered therein where high MIS device density is required and is directed to a MIS structure including at least two series devices. More particularly, the present invention is characterized by at least two series MIS transistors coupled together through a first field induced region and comprising a body of semiconductor material of first semiconductivity type having a first and second diffused region of second semiconductivity type laterally spaced in said body of semiconductor material respectively defining the drain region of one MIS transistor and the source region for the other MIS transistor. A first layer of insulated material of a predetermined thickness extends between the drain region of the first MIS transistor and the source region of the second MIS transistor. A first and second gate electrode is formed on the first layer of insulating material in mutually spaced apart relationship intermediate the drain region of the first MIS transistor and the source region of the second MIS transistor. A second layer of insulating material is deposited over the first and second gate electrode which extends between said drain and source regions. A metal electrode is formed on top of the second layer of insulated material extending between said drain and source regions and across the first and second gate electrodes. Ohmic contacts are connected to said drain and source regions and a biasing potential is applied between the semiconductor body and the metal electrode whereby three spaced apart field induced regions of second semiconductivity type and respective P-N field induced junctions are generated in said semiconductor body in the lateral portion intermediate the diffused drain and source regions not subtended by the gate electrodes. Two of the induced regions are respectively contiguous to the two diffused regions while the third induced region exists between the two gate electrodes. The third induced channel provides a common electrode between the two MIS transistors thereby forming two internally connected series devices.

DESCRIPTION OF THE PREFERRED EMBODIMENT

Figure 1:
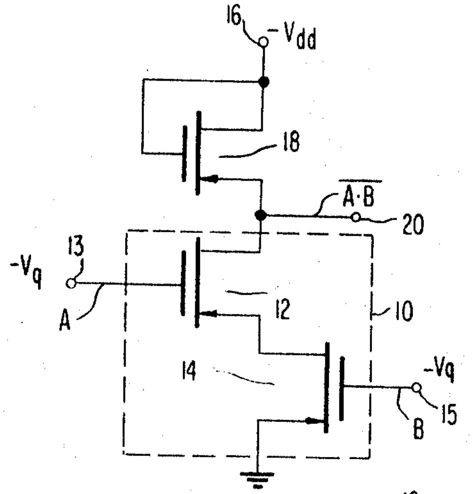
FIG. 1 is a schematic diagram illustrative of a pair of series connected MIS transistors in combination with a MIS load device.
Figure 2:
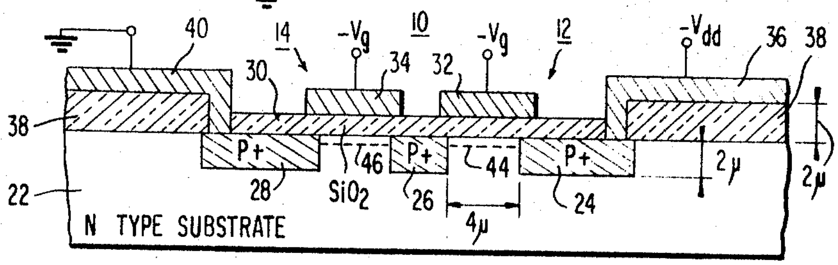
FIG. 2 (PRIOR ART)
FIG. 2 is a partial sectional view of two series MIS transistors obtained by means of diffused regions and which is typical of the prior art.
Figure 3:
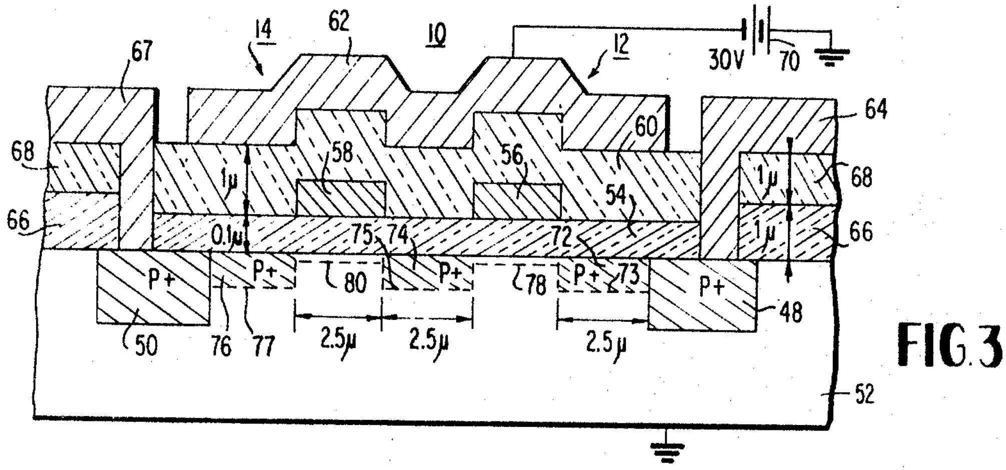
FIG. 3 is a partial sectional view of two series connected MIS transistors illustrative of the preferred embodiment of the subject invention.
Figure 4:
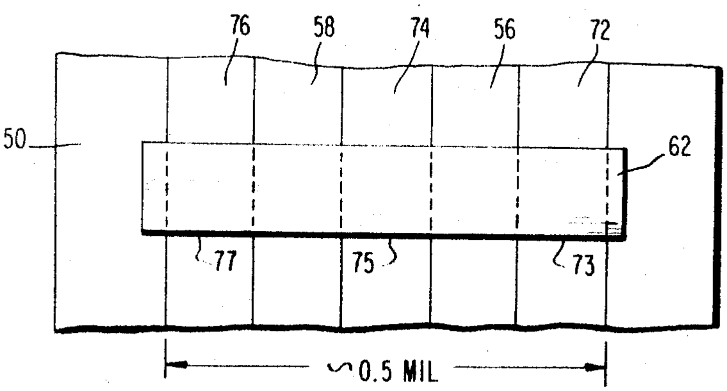
FIG. 4 is a top plan view of the embodiment shown in FIG. 3.

Referring to the drawings and more particularly to FIG. 1, reference numeral 10 generally refers to two series connected MIS transistors 12 and 14 which are disclosed by two embodiments thereof in FIG. 2 and FIGS. 3 and 4. FIG. 2, however, is illustrative of the known prior art. The two MIS transistors 12 and 14 are connected between a source of supply potential $V_{dd}$ and a point of reference potential illustrated as ground through a third MIS transistor 18 wherein the gate and drain electrodes are commonly coupled together so as to operate as a two terminal resistive load impedance. This connection is well known to those skilled in the art. The source electrode of the MIS transistor 16 is directly connected to the drain of MIS transistor 12 both of which are then connected to an output terminal 20. The source electrode of the MIS transistor 12 is common to the drain electrode of the MIS transistor 14. The gate electrodes of the respective MIS transistors 12 and 14 are adapted to have separate potentials $-V_g$ applied thereto by means of terminals 13 and 15. Typically where the $-V_g$ signal applied to the gate electrode of MIS transistor 12 corresponds to a signal A and the $-V_g$ signal applied to the gate of MIS transistor 14 corresponds to a signal B, the output signal at the output terminal 20 would correspond to the NAND function of the signals A and B, i.e., $\overline{A \cdot B}$. Thus, a series configuration of MIS transistors 12 and 14 as shown in FIG. 1 is adapted to operate as a digital logic circuit or "gate." It is desirable therefore to provide for a complete array of as many devices as possible on a single substrate.

Referring now to FIG. 2, a semiconductor structure typical of the prior art is shown including a substrate 22 of a first or N semiconductivity type in which a first, second and third region 24, 26 and 28 of opposite or P+ semiconductivity type are disposed therein by means of diffusion techniques. An insulating layer 30 of for example silicon dioxide extends between the diffused regions 24 and 28 overlapping a portion thereof. A first gate electrode 32 is formed on the insulating layer 30 so that it extends between the diffused P+ regions 24 and 26 while a second gate electrode 34 also formed on the layer 30 spaced apart from the first gate electrode 32 extends between the P+ regions 26 and 28. A first ohmic contact 36 is electrically connected to the region 24 and is insulated from the substrate 22 by means of another insulating layer 38. Another ohmic contact 40 is electrically connected to the region 28 and is insulated from the substrate 22 by means of the insulating layer 38.

The first MIS transistor 12 is defined in the configuration shown in FIG. 2 by the P+ regions 24 and 26 and the gate electrode 32 while the MIS transistor 14 shown in FIG. 1 is defined by the P+ regions 26 and 28 and the gate electrode 34. The region 24 thus becomes the drain and region 26 becomes the source respectively of the MIS transistor 12 with a channel region 44 extending therebetween at the surface of the N-type substrate 22. On the other hand, the region 26 becomes the drain of the MIS transistor 14 while the region 28 becomes the source thereof. In a like manner, a second channel region 46 extends therebetween. Gate voltage signals $-V_g$ are applied to the gate electrodes 32 and 34, respectively, and control the current flow in the channels 44 and 46 between the respective drain and source regions.

The alignment problem encountered in fabricating the diffused junctions 24, 26 and 28 limits the minimum obtainable separation therebetween as well as the spacing between the gate electrodes 32 and 34. The latter condition is necessarily interrelated to the former. As an illustrative example in the fabrication of a MIS structure wherein the diffusion regions 24, 26 and 28 have a diffusion depth in the order of 2 microns ($\mu$), a mask spacing in the order of 10 microns is necessary in order to obtain a resulting spacing of the regions for example 24 and 26 in the order of 4 microns. It is immediately evident, therefore, that the lateral spacing thus approaches a practical limit which dictates the density or number of units able to be fabricated on a predetermined size substrate.

Directing attention now to FIGS. 3 and 4 which discloses the preferred embodiment of the subject invention, the MIS transistors 12 and 14 are defined, inter alia, by two diffused P+ regions 48 and 50 running substantially parallel to one another a predetermined distance apart for example 0.5 mil in the N type substrate 52. A first insulating layer 54 extends on the surface of the substrate 52 between the diffused regions 48 and 50. A first and a second 2.5 micron wide gate electrode 56 and 58 respectively, having a spacing of for example 2.5 microns are formed on the top of the insulator layer 54 parallel to and intermediate the diffused regions 48 and 50 and extend longitudinally therewith as shown in FIG. 4. A second insulator layer 60 is deposited on the first insulator layer 54 over the first and second gate electrodes 56 and 58. Another or top electrode 62 is formed on the top portion of the second insulator layer 60 so that it extends substantially transversely across the first and second gate electrode 56 and 58 at least to the edges of the diffused P+ regions 48 and 50, respectively. A first ohmic contact 64 is electrically connected to the drain region 48 and is insulated from the substrate 52 by two layers of insulator material 66 and 68. A small spacing is adapted to be maintained between the ohmic contact 64 and the edges of the top electrode 62 and the insulator layers 54 and 56. A second ohmic contact 67 is electrically connected to the diffused region 50 and is insulated from the substrate 52 by the insulator layers 66 and 68. A small spacing is also maintained between the ohmic contact 67 and the edges of the top electrode 62 and the two insulator layers 54 and 56.

A bias potential, for example −30 volts is applied from the source 70 across the top electrode and the substrate 52 so that the negative pole of the source is applied to the top electrode whereupon three induced P+ regions 72, 74 and 76 and three respective P-N junctions 73, 75 and 77 are formed in the substrate 52 in the regions not subtended by the gate electrodes 56 and 58. The diffused region 48 and the induced region 72 are contiguous and define the drain electrode of MIS transistor 12 while the induced region 74 defines the source of MIS 12 with a channel region 78 therebetween. In a similar manner the diffused region 50 and the induced region 76 are contiguous and define the source electrode of MIS transistor 14 while the induced region 74 defines the drain of MIS transistor 14 with a channel region 80 therebetween. The induced region 74 is common to both MIS transistors 12 and 14. This series path connects the MIS transistors 12 and 14 with the diffused drain 48 providing the drain electrode of MIS transistor 12 while the diffused region 50 provides the source electrode of the second MIS transistor 14. The embodiment of the subject invention eliminates the normally diffused region between the P+ regions 48 and 50 and at the same time allows the width of these respective diffused junctions to be reduced. Inasmuch as the middle diffused region is eliminated, gate electrodes having a width of 2.5 microns can easily be fabricated 2.5 microns apart between the diffused regions 48 and 50 having a lateral separation of 0.5 mil without sacrificing the yield of operative devices. Also it is to be noted that no critical alignment between gate metal and gate insulator is required, i.e., the device is essentially self-aligned.

In addition to the non-criticality of mask alignment required to form the gate or induced junction regions, the gate to drain overlap is minimized by induced regions shown in FIG. 3 as compared to the embodiment shown in FIG. 2 and therefore the gate-to-drain capacitance $C_{g-d}$ is reduced. The figure of merit $(G_m/C)$ where $G_m$ is the transconductance and $C$ is the gate capacitance is greatly increased by the reduction of $C_{g-d}$ and represents an improvement of approximately $(10\mu/2.5\mu)^2 = 16$. As a by-product, the bandwidth of the devices are extended to greater than 100 MHz. Not only can additional logic be performed with the bias voltage applied to the top electrode, but increased transistor density is achieved by more than a factor of 20 over presently known arrays. For example, $2 \times 10^6$ transistors/in.$^2$ can be obtained by an array configured as taught by the subject invention.

By way of a more particular example as to the method of fabrication of the subject invention, a slice of N type silicon doped with an impurity such as phosphorous to a resistivity of about 10 ohm-centimeters is obtained. On a surface of the slice, an insulating film of for example silicon dioxide having a thickness of the order of 10,000 A or 1 micron is applied thereto by thermal oxidation. A photoengraving process next removes selected portions of the insulating film to define exposed surface portions on the slice. An impurity element such as boron is next diffused into the exposed portions to form the two diffused source and drain regions. Following this, a second photoengraving process removes the insulating layer of oxide between the diffused source and drain regions thereby defining the gate region. Following this, a gate region dielectric layer in the order of 1,000 A or 0.1 $\mu$ is formed thereat by one of several alternative procedures such as (1) thermal oxidation; (2) deposited gate oxide. When desirable, a layer of silicon nitride $Si_3N_4$ and silicon dioxide $SiO_2$ having a thickness in the order of 200 A is deposited. Gate metal electrode material is next deposited over the gate dielectric and a photoengraving process is used to define at least two spaced apart gate electrodes thereat. Another insulating layer such as $SiO_2$ having a thickness in the order of 10,000 A is deposited on the top of the structure and contact windows for the diffused source and drain regions are next photoengraved in the last mentioned insulating layer. A transverse top metal electrode is deposited over the gate electrodes between the diffused source and drain regions and finally, a last photoengraving process is used to define the interconnection pattern for the ohmic contacts.

What has been shown and described, therefore, is a MIS array capable of providing a density in the order of 2,000,000 transistors per square inch. This is accomplished by the self alignment feature and by removing the limitation of the lateral diffusion of diffused junctions which also causes a corresponding limitation in the metal-to-metal spacing between gates and ohmic contacts.

I claim as my invention:

1. A MIS structure including at least a first and a second series connected transistor, wherein self-alignment of gate metal over gate control regions is obtained, comprising in combination:

a body of semiconductive material having a first semiconductivity type and defining a substrate;

a first and second diffused region of second semiconductivity type in one surface of said substrate and being separated by a first predetermined lateral dimension, said first region defining a diffused source region of one transistor and said second region defining a diffused drain region of the second transistor;

a first insulating layer on said surface of said substrate extending between said source and drain regions;

at least a first and second gate electrode formed on said first insulating layer intermediate said source and drain regions and being mutually spaced apart by a second predetermined lateral dimension;

a second insulating layer formed over said first insulating layer and said first and second gate electrodes;

a top electrode formed on said second insulating layer extending across said first and second gate electrodes between said source and drain region;

a first and second ohmic contact respectively coupled to said source and drain regions; and a source of electrical bias potential applied across said top electrode and said substrate whereby at least three electrical field induced regions and respective P-N junctions are formed in said substrate between said source and drain regions wherein a first and second field induced region is respectively contiguous to said diffused source and drain region and extending in the region of said substrate not subtended by said first and second gate electrode, and a third field induced region extends in the region of said substrate between mutually opposing edges of said first and second gate electrode whereby said diffused source region and said first field induced junction comprises the source electrode and said third field induced region comprises the drain electrode of said first transistor, and whereby said third field induced region comprises the source electrode and said diffused drain region and said second field induced region comprises the drain electrode for said second transistor.

2. The invention as defined by claim 1 wherein said first and second predetermined lateral dimension provide substantially equal spacing between said gate electrodes and between said gate electrodes and their respective closest source or drain region.

3. The invention as defined by claim 1 wherein said diffused source and drain region and said first and second gate electrodes are formed in substantially parallel relationship relative to each other.

4. The invention as defined by claim 3 and wherein said top electrode is formed substantially orthogonal to said diffused source and drain regions and said first and second gate electrode.

5. The invention as defined in claim 4 wherein said first predetermined lateral dimension is in the order of 0.5 mil.

6. The invention as defined by claim 4 wherein said second lateral dimension is in the order of 2.5 microns and the width of said first and second gate electrode is also in the order of 2.5 microns.

7. The invention as defined by claim 6 and wherein said first predetermined lateral dimension is in the order of 0.5 mil.

8. The invention as defined by claim 1 wherein the thickness of said first insulating layer is in the order of one-tenth the thickness of said second insulating layer.

9. The invention as defined by claim 8 wherein the thickness of said first insulating layer is in the order of 0.1 micron.

10. The invention as defined by claim 1 and additionally including a relatively thick insulating layer at least as thick as the first and second insulating layer formed between said substrate and said first and second ohmic contact for the prevention of induced junctions.

* * * * *